United States Patent
Sugawara et al.

(10) Patent No.: US 9,422,620 B2
(45) Date of Patent: Aug. 23, 2016

(54) TRANSLUCENT HARD THIN FILM

(75) Inventors: Takuya Sugawara, Yokohama (JP);
Hikaru Aoshima, Yokohama (JP);
Yousong Jiang, Yokohama (JP); Ichiro Shiono, Yokohama (JP)

(73) Assignee: SHINCRON CO., LTD., Kanagawa (JP)

( * ) Notice: Subject to any disclaimer, the term of this patent is extended or adjusted under 35 U.S.C. 154(b) by 0 days.

(21) Appl. No.: 13/700,686

(22) PCT Filed: Feb. 16, 2012

(86) PCT No.: PCT/JP2012/053638
§ 371 (c)(1),
(2), (4) Date: Nov. 28, 2012

(87) PCT Pub. No.: WO2013/121552
PCT Pub. Date: Aug. 22, 2013

(65) Prior Publication Data
US 2014/0356601 A1 Dec. 4, 2014

(51) Int. Cl.
C03C 17/34 (2006.01)
C23C 14/06 (2006.01)
C23C 14/10 (2006.01)
C23C 14/00 (2006.01)
C23C 28/00 (2006.01)
C23C 28/04 (2006.01)

(52) U.S. Cl.
CPC .......... *C23C 14/0635* (2013.01); *C03C 17/3441* (2013.01); *C23C 14/0078* (2013.01); *C23C 14/10* (2013.01); *C23C 28/04* (2013.01); *C23C 28/42* (2013.01); *C03C 2217/78* (2013.01); *Y10T 428/24975* (2015.01)

(58) Field of Classification Search
CPC  C23C 14/0635; C23C 14/10; C23C 14/0078; C23C 28/04; C03C 17/3441; Y10T 428/24975
USPC ......... 428/332, 334, 335, 336, 699, 701, 698, 428/216, 432, 702; 359/580, 581
See application file for complete search history.

(56) References Cited

U.S. PATENT DOCUMENTS 4,846,541 A   7/1989 Miura et al.
4,971,851 A * 11/1990 Neukermans et al. ........ 428/137
(Continued)

FOREIGN PATENT DOCUMENTS

CN   102213778 A  * 10/2011
JP    60-221562 A    11/1985
(Continued)

OTHER PUBLICATIONS

Ding, Kaining, et al. "Silicon quantum dot formation in SiC/SiO x hetero-superlattice." Energy Procedia 10 (2011): 249-254.*
(Continued)

*Primary Examiner* — Aaron Austin
*Assistant Examiner* — Michael Zhang
(74) *Attorney, Agent, or Firm* — Kenealy Vaidya LLP (57) ABSTRACT

A translucent hard thin film having high transmissivity and film strength is provided. The translucent hard thin film can be composed of a laminated film formed on a substrate surface, wherein the laminated film has a superlattice structure obtained by stacking a plurality of $SiO_2$ layer and SiC layers alternately and the entire film thickness is 3000 nm or more. A film thickness per layer is 5 to 30 nm in a SiC layer and 30% to 60% of that of the $SiO_2$ layer in a SiC layer.

6 Claims, 3 Drawing Sheets

(56) References Cited

U.S. PATENT DOCUMENTS

| | | | |
|---|---|---|---|
| 5,880,491 A * | 3/1999 | Soref et al. | 257/190 |
| 6,252,295 B1 * | 6/2001 | Cote et al. | 257/635 |
| 2003/0072895 A1 * | 4/2003 | Sakakura et al. | 428/1.3 |
| 2007/0031633 A1 | 2/2007 | Satoh et al. | |

FOREIGN PATENT DOCUMENTS

| | | | |
|---|---|---|---|
| JP | 61-237492 A | 10/1986 | |
| JP | 63-113507 A | 5/1988 | |
| JP | 2001-234338 A | 8/2001 | |
| JP | 2004-335325 A | 11/2004 | |
| JP | 2007-16292 A | 1/2007 | |

OTHER PUBLICATIONS

International Search Report for PCT/JP2012/053638 dated Apr. 10, 2012.

* cited by examiner

TRANSLUCENT HARD THIN FILM

This application is a U.S. national phase filing under 35 U.S.C. §371 of PCT Application. No. PCT/JP2012/053638, filed on Feb. 16, 2012, which is hereby incorporated by reference in its entirety by reference.

TECHNICAL FIELD

The present invention particularly relates to a translucent hard thin film to be formed on a surface of a substrate made of glass, etc. required to be transparent and to have high film strength.

BACKGROUND ART

There is known a technique of forming an abrasion resistant film made of a mixture of a silicon-type compound ($Si_2N_4$, SiC and $SiO_2$) on a surface of a substrate (metal, ceramic and plastic, etc.) (Patent Document 1).

RELATED ART DOCUMENTS

Patent Document

Patent Document 1: Japanese Patent Unexamined Patent Publication (Kokai) No. S60-221562

SUMMARY OF THE DISCLOSED SUBJECT MATTER

However, the abrasion resistant film formed on the substrate surface in the patent document 1 had low transmissivity and could not used for the purposes requiring transparency.

According to another aspect of the present invention, there is provided a translucent hard thin film having high transmissivity and film strength.

According to the present invention, there is provided a translucent hard thin film formed on a surface of a substrate, configured by a laminated film having a superlattice structure, wherein a plurality of $SiO_2$ layers and SiC layers are stacked alternately, a film thickness per layer is 5 nm to 30 nm in a $SiO_2$ layer and 30 to 60% of that of the $SiO_2$ layer in a SiC layer, and an entire film thickness thereof is 3000 nm or more.

In the invention above, the SiC layer is preferably formed on a surface of the substrate or already formed $SiO_2$ layer by a method below.

The method is a film forming method of a thin film, using a film formation apparatus (radical assisted sputtering apparatus) having a configuration that a reaction processing region and a plurality of film forming regions are arranged being spatially separated from one another in a single vacuum container, each region can be controlled independently and processing is performed on a moving substrate; wherein after performing sputtering on any of a plurality of targets made of different materials in the respective film formation processing regions in an inert gas atmosphere to form an interlayer thin film containing silicon and carbon, the interlayer thin film is exposed to (or brought to contact with) plasma generated under an atmosphere of a mixed gas of an inert gas and hydrogen in the reaction processing region to obtain an ultrathin film by film conversion, then, formation of the interlayer thin film and film conversion into the ultrathin film are repeated to the ultrathin film.

According to the present invention, there is also provided an optical substrate, wherein the translucent hard thin film of the present invention is formed on the substrate made of glass.

The optical substrate has properties that a wavelength is 650 nm to 700 nm, transmissivity is 70% or higher, Vickers hardness on the thin film side is 1500 or higher and a coefficient of dynamic friction is 0.5 or smaller.

Since a translucent hard thin film according to the present invention is configured by a laminated film having a superlattice structure, wherein a $SiO_2$ layer and a SiC layer each having a specific film thickness are stacked alternately, the transmissivity and film strength can be enhanced. Since the thin film according to the present invention has high transmissivity and film strength, it is useful, for example, as a window material of a sandblast apparatus, etc. and extremely useful for other optical use purposes in which transmissivity and film strength are required.

DESCRIPTION OF NUMERICAL NOTATIONS

100 . . . optical substrate, 102 . . . laminated film (translucent hard thin film), 104 . . . $SiO_2$ layer, 106 . . . SiC layer, S . . . substrate, 1 . . . film forming apparatus (sputtering apparatus), 11 . . . vacuum container, 13 . . . substrate holder, 12, 14 and 16 . . . partition wall 20 and 40 . . . film formation process region, sputtering source (21a, 21b, 41a and 41b . . . magnetron sputtering electrode, 23 and 43 . . . AC source, 24 and 44 . . . trans, 29a, 29b, 49a and 49b . . . target), sputtering gas supply means (26 and 46 . . . sputtering gas cylinder, 25 and 45 . . . mass flow controller), 60 . . . reaction processing region, 80 . . . plasma source (81 . . . case body, 83 . . . dielectric plate, 85a and 85b . . . antenna, 87 . . . matching box, 89 . . . high frequency power source), reaction processing gas supply means (68 . . . reaction processing gas cylinder, 67 . . . mass flow controller)

EXEMPLARY MODE FOR CARRYING OUT THE DISCLOSED SUBJECT MATTER

Figure 1:
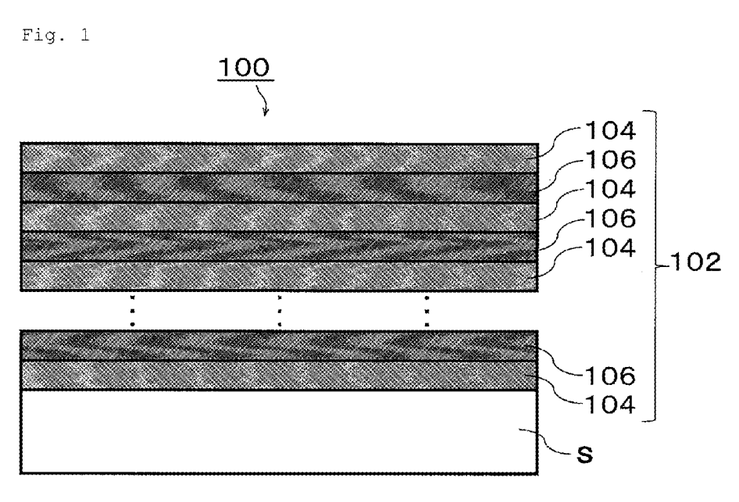
FIG. 1 is a sectional view showing a configuration of a translucent hard thin film according to the present invention.

As shown in FIG. 1, an optical substrate 100 of the present embodiment comprises a substrate S for providing translucency and film strength, and a surface of the substrate S is covered with a translucent hard laminated film 102.

As a material for composing the substrate S is, for example, crystal (crystal, lithium niobate and sapphire, etc.), glass (BK7, quartz and low-melting-point glass) and plastic, etc. may be mentioned. In the present embodiment, in particular, the effects of the present invention is easily brought out when the substrate S is configured by a relatively soft material, such as glass (6H to 7H) and plastic. Note that the number in brackets is a value of pencil hardness measured by a method based on JIS-K5600-5-4.

A laminated film 102 as an example of the translucent hard thin film according to the present invention has a superlattice structure, wherein a plurality of $SiO_2$ layers 104 and SiC layers 106 are stacked alternately, and the entire film thickness is 5000 nm or more and preferably 7000 nm or more. When the entire film thickness is 5000 nm or more, sufficient film strength can be given even when configuring the substrate S with relatively soft material, such as glass. When configuring the substrate S with a relatively hard material, such as sapphire, sufficient film strength can be obtained even when forming the laminated film 102 to have an entire film thickness of as thin as 2000 nm or so. However, since a sapphire material is expensive, there have been demands for giving sufficient film strength to the substrate S composed of a relatively inexpensive material like glass.

Note that "superlattice structure" in this embodiment indicates the structure formed by controlling film thicknesses of different materials on nano basis and stacking the films.

In the present embodiment, film thicknesses of the layers 104 and 106 composing the laminated layer 102 are as follows. The $SiO_2$ layer 104 is 5 nm or thicker per layer, preferably 10 nm or thicker but not thicker than 30 nm, preferably not thicker than 25 nm preferably not thicker than 20 nm. When the film thickness of the $SiO_2$ layer 104 is too thin, it is liable that the superlattice structure cannot be formed. While when it is too thick, Vickers hardness could decline. A thickness per layer of the SiC layer 106 is 30% or more of the film thickness of the $SiO_2$ layer 104, preferably 40% or more, more preferably 45% or more but not more than 60%, preferably not more than 55% and more preferably not more than 50%. The reason why the film thickness of the SiC layer 106 is set in accordance with the film thickness of the $SiO_2$ layer 104 is to keep the Vickers hardness of the thin film. When the film thickness of the SiC layer 106 is too thin, it is liable that the superlattice structure cannot be configured. While when it is too thick, the transmissivity is liable to be declined.

The number of layers 104 and 106 composing the laminated film 102 changes depending on the total thickness of the laminated film 102 and film thicknesses of the layers 104 and 106. But it is preferable that, for example, when the total thickness of the laminated film 102 is 7000 nm, the film thickness of the $SiO_2$ layer 104 is 5 to 30 nm or so, the thickness of the SiC 106 is 1.5 to 19 nm or so, the number of layers 104 and 106 is 300 to 800 or so, respectively, and they are alternately and repeatedly stacked so as to form the laminated film 102.

The laminated film 102 of the present embodiment has high transmissivity and film strength. Specifically, in a state where the laminated film 102 is provided on the substrate S, the transmissivity at a wavelength of 650 nm to 700 nm is 70% or higher and preferably 75% or higher, Vickers hardness HV on the thin film side is 1500 or higher, preferably 1700 or higher and more preferably 1800 or higher. Also, a coefficient of dynamic friction μk may be set to be 0.5 or smaller. An optical substrate 100, wherein a laminated film 102 as above is formed on the substrate S, can be used, for example, as a window material of a sandblast apparatus, etc.

Vickers hardness HV is one of indentation hardness used generally as a value indicating hardness of an object. The measurement method is, by using as an indenter a diamond equilateral pyramid having a facing angle of 136° against a surface of a material, to measure a diagonal length of a square indent caused by pressing a sample with a certain weight load. A surface area of the indent is obtained from the diagonal length, and a value obtained by dividing the weight load by the surface area is the Vickers hardness. The Vickers hardness is indicated only by a numerical number with no unit.

In the present embodiment, the layers 104 and 106 may be formed on the substrate S, for example, by a radical assisted sputtering (RAS) method. Particularly, when forming a SiC layer 106, by forming the film while introducing hydrogen to a film forming atmosphere, sufficient transmissivity and film strength can be given to a finally obtained multilayer film 102 as will be explained later on.

Figure 2:
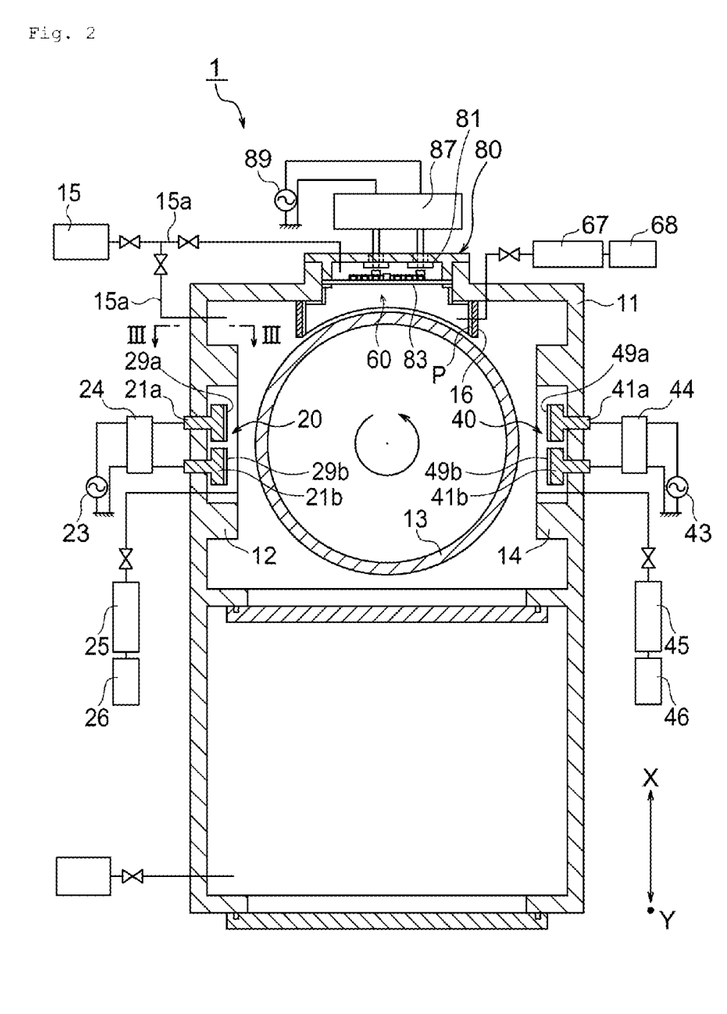
FIG. 2 is a partial cross-sectional view showing an example of a film forming apparatus for performing a RAS method.
Figure 3:
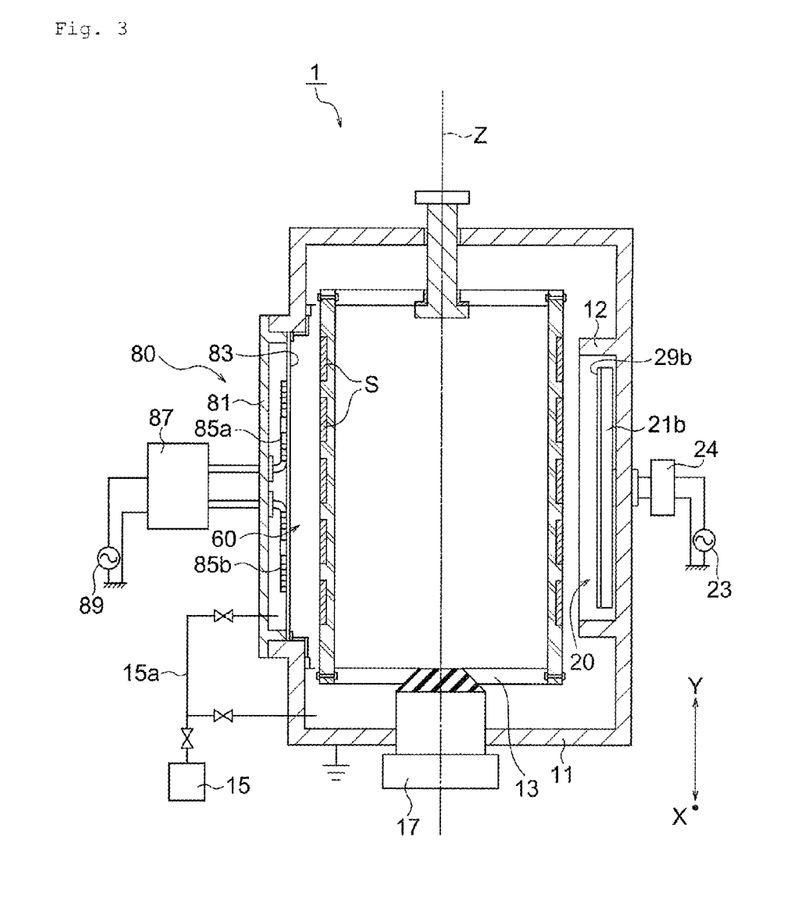
FIG. 3 is a partial vertical sectional view along the line in FIG. 2.

As shown in FIG. 2 and FIG. 3, a film forming apparatus 1 as an example capable of performing a RAS method (hereinafter, simply referred to as abbreviated "sputtering apparatus 1") comprises a vacuum container 11 having an approximate rectangular parallelepiped hallow shape. A pipe 15a for exhaust is connected to the vacuum container 11 and the pipe is connected to a vacuum pump 15 for vacuuming inside the container 11. The vacuum pump 15 is configured, for example, by a rotary pump and turbo molecular pump (TMP), etc. A substrate holder 13 is provided inside the vacuum container 11. The substrate holder 13 is configured by a cylinder-shaped member for holding the substrate S, on which a film is formed, on its outer circumferential surface inside the vacuum container 11. The substrate holder 13 in this embodiment is provided in the vacuum container 11, so that a rotation axis Z extending in the cylindrical direction is in the vertical direction (Y direction) of the vacuum container 11. By driving the motor 17, the substrate holder 13 rotates about the axis Z.

In the present embodiment, there are two sputtering sources and one plasma source 80 provided around the substrate holder 13 arranged inside the vacuum container 11.

In front of the respective sputtering sources, film forming regions 20 and 40 are formed, respectively. The regions 20 and 40 are surrounded from four directions by partition walls 12 and 14 respectively protruding from an inner wall surface of the vacuum container 11 toward the substrate holder 13, so that an independent space can be secured for each of the regions inside the vacuum container 11. In the same way, a reaction processing region 60 is formed in front of the plasma source 80. The region 60 is also surrounded from four directions by partition walls 16 protruding from the inner wall surface of the vacuum container 11 toward the substrate holder 13 and, thereby, a space is also secured for the region 60 independently from the regions 20 and 40 inside the vacuum container 11. In the present embodiment, it is configured that processing in each of the regions 20, 40 and 60 can be controlled separately.

The respective sputtering sources in the present embodiment are configured to be a dual cathode type provided with two magnetron sputtering electrodes 21a and 21b (or 41a and 41b). When forming a film (which will be explained later on), targets 29a and 29b (or 49a and 49b) are respectively held in a detachable way on surfaces of one end of the electrodes 21a and 21b (or 41a and 41b). On the other end of the electrodes 21a and 21b (or 41a and 41b), an AC source 23 (or 43) as a power supply means is connected via a trans 24 (or 44) as a power control means for adjusting the electric energy, so that it is configured to apply an alternating voltage of, for example, 1 k to 100 kHz or so to the respective electrodes 21a and 21b (or 41a and 41b).

Each of the sputtering sources is connected to a sputtering gas supply means. The sputtering gas supply means of the present embodiment comprises a gas cylinder 26 (or 46) for storing a sputtering gas and a mass flow controller 25 (or 45) for adjusting a flow amount of the sputtering gas supplied from the cylinder 26 (or 46). The sputtering gas is introduced to the region 20 (or 40) through a pipe. The mass flow controller 25 (or 45) is a device for adjusting a flow amount of the sputtering gas. After a flow amount from the cylinder 26 (or 46) is adjusted by the mass flow controller 25 (or 45), the sputtering gas is introduced to the region 20 (or 40).

The plasma source 80 of the present embodiment comprises a case body 81 fixed to cover an opening formed on the wall surface of the vacuum container 11 and a dielectric plate 83 fixed to the case body 81. It is configured that, as a result that the dielectric plate 83 is fixed to the case body 81, an antenna housing chamber is formed in a region surrounded by the case body 81 and the dielectric plate 83. The antenna housing chamber is connected with the vacuum pump 15 through a pipe 15a and the antenna housing chamber can be in a vacuum state by exhausting by vacuuming using the vacuum pump 15.

The plasma source 80 comprises antennas 85a and 85b in addition to the case body 81 and the dielectric plate 83. The antennas 85a and 85b are connected to a high frequency power source 89 via a matching box 87 for housing a matching circuit. The antennas 85a and 85b are supplied with power from the high frequency power source 89 and generate an induction field inside the vacuum container 11 (region 60), so that plasma is generated in the region 60. In the present embodiment, it is configured that an alternating voltage having a frequency of 1 to 27 MHz is applied from the high frequency power source 89 to the antennas 85a and 85b to generate in the region 60 plasma of reaction processing gas. A variable capacitor is provided in the matching box 87, so that the power supplied from the high frequency power source 89 to the antennas 85a and 85b can be changed.

The plasma source 80 is connected to a reaction processing gas supply means. The reaction processing gas supply means in the present embodiment comprises a gas cylinder 68 for storing a reaction processing gas and a mass flow controller 67 for adjusting a flow amount of the reaction processing gas to be supplied from the cylinder 68. The reaction processing gas is introduced to the region 60 through a pipe. The mass flow controller 67 is a device for adjusting a flow amount of the reaction processing gas. After a flow amount from the cylinder 68 is adjusted by the mass flow controller 67, the reaction processing gas is introduced to the region 60.

Note that the reaction processing gas supply means is not limited to the configuration above (namely, the configuration comprising one cylinder and one mass flow controller) and may be configured to comprise a plurality of cylinders and mass flow controllers (for example, as in a later explained embodiment, the configuration comprising three gas cylinders separately storing an inert gas, oxygen and hydrogen and three mass flow controllers for adjusting flow amounts of gases supplied from the respective cylinder).

Next, an example of a film forming method of a multilayer film using the sputtering apparatus 1 will be explained.

(1) First, preliminary preparation of film forming is made. Specifically, targets 29a and 29b (or 49a and 49b) are set on electrodes 21a and 21b (or 41a and 41b). Along therewith, substrates S as film forming objects are set on the substrate holder 13 outside of the vacuum container 11 and housed in a load lock chamber in the vacuum container 11.

On the outer circumferential surface of the substrate holder 13, a plurality of substrate S are arranged discontinuously along the rotation direction (crossing direction) of the substrate holder 13, and a plurality of substrates S are arranged discontinuously along the parallel direction (vertical direction, Y direction) with the axis Z of the substrate holder 13.

The targets 29a and 29b (or 49a and 49b) are obtained by shaping a film material into a plate and held respectively on the surfaces of the electrodes 21a and 21b (or 41a and 41b), so that their longitudinal direction becomes parallel with the rotation axis Z of the substrate holder 13 and their surfaces in the parallel direction face the side surface of the substrate holder 13. In the present embodiment, those composed of silicon (Si) are used as the targets 29a and 29b and those composed of carbon (C) are used as the targets 49a and 49b.

As the target 49a and 49b, instead of those composed of carbon (C), those composed of silicon carbide (SiC) which is a compound of a plurality of elements may be used in some cases. As a silicon carbide target, those obtained, for example, by the method below may be used. First, a silicon carbide powder is added with a dispersant, a binder (for example, an organic binder) and water, agitated to fabricate a SiC slurry and molded (for example, by casting molding, press molding and extrusion molding, etc.) into a mold. Next, the obtained mold is fired, for example, in vacuum or in a non-oxidizing atmosphere at 1450 to 2300° C. or so (preferably 1500 to 2200° C. and more preferably 1600 to 1800° C.) to be sintered. Then, the obtained sintered body is impregnated with melt Si in vacuum or in a reduced non-oxidizing atmosphere at 1450 to 2200° C. or so (preferably 1500 to 2200° C. and more preferably 1500 to 1800° C.) to fill pores in the sintered body with Si. In the present embodiment, a SiC target having a density of 3 g/cm$^3$ or higher obtained thereby may be used. With a uniform SiC target having a high density, stable high-input discharge can be performed when forming a film by sputtering, which can contribute to an improvement of the film forming rate.

Next, after moving the substrate holder 13 to the film forming chamber of the vacuum container 11, the vacuum container 11 is tightly closed in a state where a door to the load lock chamber is closed, and inside the vacuum container 11 is brought to be in a high vacuum state of 10$^{-5}$ to 0.1 Pa or so by using the vacuum pump 15. During this time, a valve is open and the antenna housing chamber of the plasma source 80 is exhausted at the same time.

Next, the motor 17 starts to drive and rotates the substrate holder 13 about the axis Z. Consequently, the substrates S held on the outer circumferential surface of the substrate holder 13 revolve about the axis Z as a rotational axis of the substrate holder 13 and move repeatedly among positions of facing to the regions 20 and 40 and a position of facing to the region 60. In the present embodiment, sufficient rotation rate of the substrate holder 13 is 10 rpm or higher, but it is preferably 50 rpm or higher and more preferably 80 rpm or higher. In the present embodiment, the upper limit of the rotation rate of the substrate holder 13 is, for example, 150 rpm or so and preferably 100 rpm.

(2) Then, film forming starts. When forming a SiO$_2$ layer 104 (a thin film made of silicon oxide), sputtering processing performed in the region 20 and plasma exposure processing performed in the region 60 are repeated sequentially. In that case, an interlayer thin film is formed on a surface of a substrate S or an already formed SiC layer 106 in the sputtering processing in the region 20 and, after that, the interlayer film is subjected to film conversion and becomes an ultrathin film in the plasma exposure processing in the region 60. As a result of repeating the sputtering processing and plasma exposure processing, next ultrathin film is deposited on an ultrathin film. This operation is repeated until the SiO$_2$ film 104 finally reaches a predetermined film thickness. Note that "interlayer thin film" here is a thin film formed by passing through the region 20.

When forming a SiC layer 106 (a thin film made of silicon carbide), processing at the region 40 also starts and successive sputtering processing performed at two regions 20 and 40 and the plasma exposure processing at the region 60 are repeated sequentially. In that case, an interlayer thin film is formed on the substrate S or on a surface of an already formed SiO$_2$ layer 104 by the both successive sputtering processing in the regions 20 and 40, and the interlayer thin film becomes an ultrathin film by film conversion in the subsequent plasma exposure processing in the region 60. As a result that the both sputtering processing and the plasma exposure processing are performed repeatedly, next ultrathin film is deposited on an ultrathin film. This operation is repeated until the SiC layer 106 finally reaches a predetermined film thickness. Note that "interlayer thin film" here is a thin film formed by passing through both of the region 20 and the region 40.

In the present embodiment, because a plurality of the ultrathin films are deposited to form the final thin film (a thin film having an intended film thickness), the term "ultrathin film" is used for preventing confusing it with the finally obtained "thin film" and also used in a meaning that it is well thinner than the final "thin film".

(3) In the present embodiment, as a result that film formation of a $SiO_2$ layer 104 and film formation of a SiC layer 106, which will be explained below, are repeated for necessary times, the substrate S is covered with a multilayer film 102 having a cyclic structure composed of $SiO_2$ layers 104 and SiC layers 106.

<Film Formation of $SiO_2$ Layer 104>

After confirming pressure stability inside the vacuum container 11, a pressure in the region 20 is adjusted, for example, to 0.05 to 0.2 Pa, then, a predetermined flow amount of sputtering gas is introduced to the region 20 from the gas cylinder 26 via the mass flow controller 25.

In the present embodiment, an inert gas was used alone as a sputtering gas, and a reaction gas, such as nitrogen and oxygen, is not used together. Therefore, the film forming rate does not decline comparing with that in the case of a reactive sputtering method wherein a reaction gas as such is introduced together. An introducing flow amount of an inert gas is a little larger than that in the usual condition, such as, 100 to 600 sccm, preferably, 400 to 550 sccm or so. Consequently, it becomes an inert gas atmosphere around the targets 29a and 29b. In this state, an alternating voltage is applied to the electrodes 21a and 21b from the AC source 23 via the trans 22 so as to cover the targets 29a and 29b with an alternating electric field. By introducing a little larger amount than that in the normal condition (for example, 150 sccm or so), various properties of respective films (adhesiveness, film stress and mechanical characteristics, etc.) are expected to be improved, consequently, it can contribute to an improvement of film strength of the finally obtained multilayer film 102.

In the present embodiment, a power (sputtering power) is supplied, so that a sputtering power density to the targets 29a and 29b becomes preferably 7.0 W/cm$^2$ or higher and more preferably 8.0 W/cm$^2$ or higher, but preferably 10.0 W/cm$^2$ or lower and more preferably 9.0 W/cm$^2$ or lower. "Power density" means a power (W) supplied to the targets 29a and 29b (or 49a and 49b) per unit area (cm$^2$) (It will be the same below).

By supplying power to the targets 29a and 29b, the target 29a becomes cathode (negative electrode) at one point and the target 29b inevitably becomes anode (positive electrode) at the same time. At the next moment, when the direction of the alternating power changes, the target 29b in turn becomes cathode (negative electrode) and the target 29a becomes anode (positive electrode). As a result that the targets 29a and 29b in a pair alternately become anode and cathode, a part of the sputtering gas (inert gas) around the targets 29a and 29b emits electrons and becomes ionized. A leakage magnetic field is formed on the surfaces of the targets 29a and 29b by magnets arranged at the electrodes 21a and 21b, therefore, the electrons go around drawing a toroidal curve in the magnetic field generated near the surfaces of the targets 29a and 29b. Strong plasma is generated along the orbit of the electrons, ions of the sputtering gas in the plasma are accelerated toward a target in a negative potential state (cathode side) to collide with each of the targets 29a and 29b, so that atoms and particles (Si atoms and Si particles) on the surfaces of the targets 29a and 29b are beaten out (sputtered). These atoms and particles are film raw materials, materials for a thin film, which adhere to the surface of the substrate S or already formed SiC layer 106 so as to form an interlayer thin film. Sputtering of a silicon target in the region 20 is as above.

In the present embodiment, the region 60 is activated together with activation of the region 20. Specifically, a reaction processing gas in a predetermined flow amount is introduced from the gas cylinder 68 to the region 60 via the mass flow controller 67 so as to bring the vicinity of the antennas 85a and 85b a predetermined gas atmosphere.

A pressure of the region 60 is maintained, for example, to 0.07 to 1 Pa. Also, at least during plasma is generated in the region 60, the pressure inside the antenna housing chamber is maintained to 0.001 Pa or lower. In a state where the reaction processing gas is introduced from the cylinder 68, when a voltage having a frequency of 100 k to 50 MHz (preferably 1M to 27 MHz) is applied to the antennas 85a and 85b from the high frequency power source 89, plasma is generated in a region facing to the antennas 85a and 85b in the region 60. Power (plasma processing power) supplied from the high frequency power source 89 may be as large as, for example, 3 kW or more, preferably 4 kW or more and more preferably 4.5 kW or more when the substrate S is configured by a glass material while as small as, for example, 1 kW or less, preferably 0.8 kW or less and more preferably 0.5 kW or less.

When forming a $SiO_2$ layer 104, oxygen is used as a reaction processing gas. Thus, plasma of an oxygen gas to be generated is introduced to the region 60. When the substrate holder 13 rotates to feed substrates S to the region 60, an interlayer thin film formed on a surface of each substrate S or already formed SiC layer 106 is subjected to plasma exposure processing in the region 20 and, thereby, converted to an incomplete silicon oxide having a desired composition ($SiO_{2x}$ (x1<x2<2)) or silicon oxide ($SiO_2$) so as to form an ultrathin film. Plasma exposure performed on an interlayer thin film in the region 60 is as explained above.

In the present embodiment, until an ultrathin film to be formed on a surface of the substrate S or already formed SiC layer 106 reaches a predetermined film thickness, the sputtering and plasma exposure are repeated so as to generate a thin film ($SiO_2$ layer 104) composed of a silicon oxide having a desired film thickness.

<Film Formation of SiC Layer 106>

After confirming pressure stability inside the vacuum container 11 as same as when forming a $SiO_2$ film 104, a pressure in the region 20 is adjusted, for example, to 0.05 to 0.2 Pa, then, a predetermined flow amount of sputtering gas is introduced from the gas cylinder 26 to the region 20 via the mass flow controller 25.

An inert gas is used alone as a sputtering gas. An introducing flow amount of the inert gas is, for example, 100 to 600 sccm and preferably 150 to 500 sccm or so. After bringing the vicinity of the targets 29a and 29b to be an inert gas atmosphere, an alternating voltage is applied from the AC source 23 to the electrodes 21a and 21b via a trans 22 so as to cover the targets 29a and 29b with an alternating electric field.

In the present embodiment, sputtering power is supplied to the target 29a and 29b, so that a sputtering power density becomes 1.2 W/cm$^2$ or higher, preferably 1.4 W/cm$^2$ or higher and particularly 1.5 W/cm$^2$ or higher, but 5.0 W/cm$^2$ or lower, preferably 3.5 W/cm$^2$ or lower and particularly preferably 3.0 W/cm$^2$ or lower.

As a result of supplying power to the targets 29a and 29b, the targets 29a and 29b in a pair alternately become anode and cathode as explained above. Thereby, a part of the sputtering gas (inter gas) in the vicinity of the targets 29a and 29b emits electrons and becomes ionized. The emitted electrons go around drawing a toroidal curve in the leakage magnetic field generated near the surfaces of the targets 29a and 29b. Strong plasma is generated along the electron orbit and ions of the sputtering gas in the plasma are accelerated toward a target in a negative potential state (cathode side) to collide with each of the targets 29a and 29b, so that atoms and particles on the surfaces of the targets 29a and 29b (Si atoms and Si particles) are beaten out (sputtered). The atoms and particles are film raw materials, materials of a thin film, which adhered to the surface of the substrate S or already formed $SiO_2$ layer 104. Sputtering of a silicon target in the region 20 is as above.

When forming a SiC layer 106, being different from the case of forming a $SiO_2$ layer 104 explained above, the region 40 is also activated together with activation of the region 20 (supply of a sputtering gas and supply of power from the AC source 23). Specifically, a pressure in the region 40 is adjusted, for example, to 0.05 to 0.2 Pa, then, a sputtering gas in a predetermined flow amount is introduced to the region 40 from the gas cylinder 46 via the mass flow controller 46.

In the present embodiment, an inter gas was used alone as a sputtering gas in the same way as above, and an introducing flow amount of the inter gas is, for example, 100 to 600 sccm and preferably 150 to 500 sccm or so. Thereby, the vicinity of the targets 49a and 49b also becomes an inert gas atmosphere. In this state, an alternating voltage is applied from the AC source to the electrodes 41a and 41b via the trans 42 so as to cover the targets 49a and 49b with an alternating electric field.

In the present embodiment, it is preferable to supply power to the targets 49a and 49b, so that a sputtering power density becomes predetermined times (for example, 2 to 5 times, preferably 2.3 to 4.5 times and particularly preferably 2.5 to 4 times or so) a power density of sputtering the targets 29a and 29b. Thereby, it becomes possible to efficiently form a thin film (SiC layer 106) composed of silicon carbide having high transmissivity and film strength. As a result, transmissivity and film strength of the finally formed laminated film 102 are also improved. The power density to the targets 49a and 49b is, for example, 3.0 to 10.0 W/cm², preferably 3.5 to 9.0 W/cm² and particularly preferably 4.0 to 8.0 W/cm² or so when the power density to the targets 29a and 29b above is 1.5 to 2.0 W/cm².

Note that those composed of silicon (Si) may be used as the targets 29a and 29b and those composed of silicon carbide (SiC) may be used as the targets 49a and 49b. In that case, power can be supplied to the targets 49a and 49b, so that a sputtering power density becomes predetermined times (for example, 2 to 3 times, preferably 2.3 to 2.8 times and particularly preferably around 2.5 times) a power density of sputtering the targets 29a and 29b. In that case, when the power density to the targets 29a and 29b above is 3.0 to 4.0 W/cm² (preferably 3.3 to 3.7 W/cm² and particularly preferably around 3.5 W/cm²), the power density to the targets 49a and 49b may be, for example, 7.5 to 10 W/cm², preferably 8.2 to 9.3 W/cm² and particularly preferably around 8.8 W/cm².

In the same way as explained above, by supplying power to the targets 49a and 49b, the target 49a becomes cathode at one point and the target 49b inevitably becomes anode at the same time. When the direction of the alternating power changes at the next moment, the target 49b becomes cathode and the target 49a becomes anode. As a result that the targets 49a and 49b in a pair alternately become anode and cathode, a part of the sputtering gas (inert gas) around the targets 49a and 49b emits electrons and becomes ionized. Since a leakage magnetic field is formed on the surface of the targets 49a and 49b by magnets arranged at the electrodes 41a and 41b, the electrons go around drawing a toroidal curve in the magnetic field generated near the surface of the targets 49a and 49b. Strong plasma is generated along the orbit of the electrons, ions of the sputtering gas in the plasma are accelerated toward a target in a negative potential state (cathode side) to collide with each of the targets 49a and 49b, so that atoms and particles (C atoms and C particles) on the surfaces of the targets 49a and 49b are beaten out. These atoms and particles are film raw materials, materials for a thin film, which adhere to Si atoms and Si particles already adhered to the substrate S or already formed $SiO^2$ layer 104 in this embodiment so as to form an interlayer thin film. Sputtering of carbon targets (or silicon carbide target) in the region 40 is as above. Note that the interlayer thin film here is composed of a mixture of elements (Si atoms or Si particles and C atoms or C particles) and assumed not in a firm chemical binding state.

In the present embodiment, the region 60 is also activated together with activation of the regions 20 and 40 in the same way as in the case of forming the $SiO_2$ layer 104 above.

When forming a SiC layer 106, it is preferable to use a mixed gas of an inert gas and hydrogen as a reaction processing gas thereof. Then, ions ($H_2+$) of hydrogen molecules ($H_2$) and/or active species of hydrogen are present as a consequence, and they are introduced to the region 60. When the substrate holder 13 rotates to feed the substrates S to the region 60, an interlayer thin film composed of a mixture of Si and C formed on the surface of each substrate S or already formed $SiO_2$ layer 104 in the regions 20 and 40 is subjected to plasma exposure processing and turned to a compound of Si and C in a chemically firm binding state by film conversion so as to form an ultrathin film. Plasma exposure to the interlayer thin film in the region 60 is as explained above.

In the present embodiment, the both sputtering and the plasma exposure processing are repeated until the ultrathin film to be formed on the surface of each substrate or already formed $SiO_2$ layer 104 becomes a predetermined film thickness so as to form a thin film composed of silicon carbide (SiC layer 106) having an intended film thickness.

The present inventors found the fact that, by bringing plasma generated in an atmosphere of a mixed gas of an inert gas and hydrogen contact with the interlayer thin film to convert it to an ultrathin film and, then, stacking ultrathin films to a predetermined film thickness, a thin film composed of silicon carbide having high transmissivity and film strength can be formed, consequently, it is possible to contribute to an improvement of transmissivity and film strength of the finally obtained laminated film 102. It is not all clear the reason why a thin film composed of silicon carbide having excellent film properties can be obtained by performing processing as above and that consequently contributes to an improvement of transmissivity and film strength of the finally obtained laminated film 102. When forming a thin film composed of silicon carbide, the configuration is largely different from that of normal continuous film forming (vacuum deposition method, etc.) on the point that deposition of interlayer thin film and exposure to plasma are independent in terms of time and cyclically repeated. Furthermore, in the present embodiment, the deposited interlayer thin film is exposed to particular plasma generated in an atmosphere of a mixed gas obtained by including hydrogen in an inert gas. It is presumed that, by bringing particular plasma contact with an interlayer thin film, during film conversion of the interlayer thin film into an ultrathin film, the interlayer thin film efficiently takes in energy from ions ($H_2+$) of hydrogen molecules and active species in plasma, consequently, highly strong binding is attained between atoms, and transmissivity and film strength of a thin film composed of silicon carbide are improved, which contribute to an improvement of transmissivity and film strength of a finally laminated film 102 as a consequence.

The present inventors consider that particularly ions ($H_2+$) of hydrogen molecules in plasma work to promote binding of atoms in the interlayer thin film.

A mixing ratio of an inert gas and hydrogen when forming a SiC layer 106 is preferably 97:3 to 80:20 (namely, a hydrogen concentration of 3 to 20%), more preferably 97:3 to 90:10 (hydrogen concentration of 3 to 10%), furthermore preferably 97:3 to 94:6 (hydrogen concentration of 3 to 6%) and particularly preferably around 95:5 (hydrogen concentration of around 5%) in a volume conversion. There is a tendency that transmissivity of a thin film composed of silicon carbide becomes higher as the hydrogen concentration becomes higher, however, when the concentration is too high (for example, exceeding 20%), it may affect safety control in the manufacture procedure and it is liable that balance becomes poor between transmissivity and film strength of a thin film composed of silicon carbide to be formed, which may adversely affect a finally obtained laminated film 102. On the other hand, when the hydrogen concentration is too low, transmissivity of an obtained thin film composed of silicon carbide is deteriorated, which may adversely affect the finally obtained laminated film 102 in the same way.

A flow amount of introducing the mixed gas when forming a SiC layer 106 is, for example, 300 to 1000 sccm and preferably 400 to 600 sccm or so. When the introducing flow amount is small, it is liable that transmissivity and film strength of a silicon carbide to be formed decline. While when the introducing flow amount is too large, a security hazard may arise.

For example, argon and helium, etc. are possible as an inert gas in general in the both sputtering processing and the plasma exposure processing explained above. In the present embodiment, the case of using argon as an inert gas will be explained.

The embodiments explained above are described to facilitate understanding of the present invention and are not to limit the present invention. Accordingly, respective elements disclosed in the above embodiments include all design modifications and equivalents belonging to the technical scope of the present invention.

In the above embodiments, the explanation was made on the case of forming a laminated film 102 by using a sputtering apparatus 1 capable of performing a radical assisted sputtering method, wherein magnetron sputtering as an example of sputtering is performed. However it is not limited to this case and the film may be formed by other sputtering methods using a film formation apparatus for other well known sputtering, such as double-pole sputtering not using magnetron discharge. Note that the atmosphere in the sputtering is an inert gas atmosphere in all cases.

EXAMPLES

Next, the present invention will be explained further in detail by using more specific examples of the embodiments of the invention explained above.

Experimental Examples 1 to 23

By using the sputtering apparatus 1 shown in FIG. 2 and FIG. 3, a plurality of glass substrates BK7 as substrates S (note that a sapphire substrate was used in the example 1-1) were set on the substrate holder 13 and film formation of $SiO_2$ layer 104 and film formation of SiC layer 106 were repeated alternately under the condition below, so that samples were obtained for respective examples, wherein a laminated film 102 having a superlattice structure was formed on each substrate S. Note that a $SiO_2$ layer 104 was formed as the first and last layers of the laminated film 102 in all samples.

<Film Formation of $SiO_2$ Layer 104>
Film Forming Rate: 0.4 nm/sec
Substrate Temperature: room temperature
<<Sputtering in Region 20>>
Sputtering Gas: Ar
Sputtering Gas pressure: 0.1 Pa
Flow Amount of Introducing Sputtering Gas: 500 sccm
Targets 29a and 29b: Silicon (Si)
Sputtering Power Density: 8.5 W/cm$^2$
Frequency of Alternating Voltage Applied to Electrodes 21a and 21b: 40 kHz
<<Plasma Exposure in Region 60>>
Reaction Processing Gas: $O_2$
Flow Amount of Introducing Reaction Processing Gas: 200 sccm
Power Supplied from High Frequency Power Source 89 to Antennas 85a and 85b (Plasma Processing Power): 2 kW
Frequency of Alternating Voltage Applied to Antennas 85a and 85b: 13.56 MHz
<<Other>>
Film Thickness per Layer: 4 nm to 35 nm (refer to Table 1)
Number of Laminated Layers: 100 to 1120 layers (refer to Table 1)
<Film Formation of SiC Layer 106>
Film Forming Rate: 0.09 nm/sec.
Substrate Temperature: room temperature
<<Sputtering in Region 20>>
Sputtering Gas: Ar
Sputtering Gas Pressure: 0.1 Pa
Flow Amount of Introducing Sputtering Gas: 150 sccm
Targets 29a and 29b: Silicon (Si)
Sputtering Power Density: 1.5 W/cm$^2$
Frequency of Alternating Voltage Applied to Electrodes 21a and 21b: 40 kHz
<<Sputtering in Region 40>>
Sputtering Gas: Ar
Sputtering Gas Pressure: 0.1 Pa
Flow Amount of Introducing Sputtering Gas: 150 sccm
Targets 49a and 49b: Carbon (C)
Sputtering Power Density: 4.3 W/cm$^2$
(equivalent to approximately 2.9 times a power density for sputtering targets 29a and 29b composed of silicon (Si))
Frequency of Alternating Voltage Applied to Electrodes 41a and 41b: 40 kHz
<<Plasma Exposure in Region 60>>
Reaction Processing Gas: Ar+$H_2$
Hydrogen Concentration in Reaction Processing Gas: refer to Table 1
Reaction Processing Gas Pressure: 0.3 Pa
Flow Amount of Introducing Reaction Processing Gas: 500 sccm
Plasma Processing Power: 2 kW
Frequency of Alternating Voltage Applied to Antennas 85a and 85b: 13.56 MHz
<<Other>>
Film Thickness per Layer: 1.25 nm to 21 nm (refer to Table 1)
Number of Laminated Layers: 100 to 1120 layers (refer to Table 1)
<Laminated Film 102>
Film Thickness: 2000 nm to 7000 nm (refer to Table 1)
<<Evaluation>>
Properties of the obtained samples were evaluated in the methods explained below, and the results are shown in Tables below.

(1) Evaluation of Film Strength

A microhardness tester (MMT-X7 made by Matsuzawa Co., Ltd.) was used to measure hardness of a laminated film surface of the example samples under the measurement condition below.

Indenter Shape: Vickers indenter)(a=136°
Measurement Environment: temperature 20° C., relative humidity 60%
Test Load: 25 gf
Loading speed: 10 μ/s
Maximum Load Creep Time: 15 seconds (2) Evaluation of Transmissivity Transmissivity at a wavelength of 650 nm to 700 nm was measured by using a spectral photometer (product name: U-4000 made by Hitachi High-Technologies Corporation).

(3) Evaluation of Sliding Property

An automatic friction abrasion analyzer (Triboster TS501 made by Kyowa Interface Science Co., Ltd.) using a horizontal linear reciprocating motion system was used to measure a coefficient of dynamic friction (μk) on the laminated film side of the samples under the condition of a load: 50 g, speed: 60 mm/min. and measurement reciprocating times: 10 times.

ing the number of repetitive lamination of both layers while film thicknesses of each $SiO_2$ layer 104 and each SiC layer 106 being fixed, samples with thicker film thicknesses (experimental examples 2 to 5) were confirmed to be usable comparing with samples (experimental example 1) wherein a film thickness of the laminated film 102 was thin.

When changing a film thickness of the SiC layer 106 while keeping a film thickness of the entire laminated film 102 and that of the $SiO_2$ layer 104 fixed, comparing with the samples (experimental examples 6, 9, 11, 14, 15 and 18), wherein a film thickness of a SiC layer 106 is out of a range of 30 to 60% of a film thickness of a $SiO_2$ layer 104, samples (experimental examples 7, 8, 12, 13, 16 and 17) within the range were confirmed to be usable.

Even when thickening the film thickness of the entire laminated film 102 and keeping the film thickness of each SiC layer 106 in a range of 30 to 60% of that of a $SiO_2$ layer 104, samples (experimental examples 10 and 19), wherein a film thickness of one $SiO_2$ layer was out of the range of 5 to 30 nm, were confirmed to be not as usable as samples (experimental examples 8 and 17, etc.) within the range.

TABLE 1

| Experimental Example | Substrate Material | Laminated Film Film Thickness (nm) | $SiO_2$ Layer Film Thickness/ Layer (nm) | $SiO_2$ Layer Number of Layer | SiC Layer Film Thickness/ Layer | SiC Layer % to $SiO_2$ | SiC Layer Number of Layer | SiC Layer Hydrogen Concentration (%) | Vickers Hardness HV | Transmissivity (%) | Dynamic Friction Coefficient μk |
|---|---|---|---|---|---|---|---|---|---|---|---|
| *1 | BK7 | 2000 | 15 | 100 | 5 | 33 | 100 | 5 | 1200 | 50 | 0.70 |
| 2 | | 3000 | | 150 | | | 150 | | 1500 | 78 | 0.17 |
| 3 | | 4000 | | 200 | | | 200 | | 1600 | 77 | 0.17 |
| 4 | | 5000 | | 250 | | | 250 | | 1700 | 76 | 0.17 |
| 5 | | 7000 | | 350 | | | 350 | | 1700 | 77 | 0.17 |
| *6 | | 7000 | 5 | 1120 | 1.25 | 25 | 1120 | | 1300 | 80 | 0.40 |
| 7 | | | | 1077 | 1.5 | 33 | 1077 | | 1500 | 77 | 0.20 |
| 8 | | | | 1000 | 2 | 40 | 1000 | | 1800 | 75 | 0.17 |
| *9 | | | | 843 | 3.3 | 65 | 843 | | 1800 | 50 | 0.17 |
| *10 | | | 4 | 1094 | 2.4 | 60 | 1094 | | 1800 | 55 | 0.17 |
| *11 | | | 15 | 373 | 3.75 | 25 | 373 | | 1400 | 80 | 0.30 |
| 12 | | | | 359 | 4.5 | 33 | 359 | | 1500 | 77 | 0.20 |
| 13 | | | | 333 | 6 | 40 | 333 | | 1700 | 75 | 0.17 |
| *14 | | | | 282 | 9.8 | 65 | 282 | | 1800 | 50 | 0.17 |
| *15 | | | 30 | 187 | 7.5 | 25 | 187 | | 1300 | 80 | 0.50 |
| 16 | | | | 175 | 10 | 33 | 175 | | 1500 | 77 | 0.45 |
| 17 | | | | 167 | 12 | 40 | 167 | | 1500 | 75 | 0.40 |
| *18 | | | | 141 | 19.5 | 65 | 141 | | 1800 | 50 | 0.17 |
| *19 | | | 35 | 125 | 21 | 60 | 125 | | 1800 | 55 | 0.17 |

*indicates a comparative example.

TABLE 2

| Experimental Example | Substrate Material | Laminated Film Film Thickness (nm) | SiO2 Layer Film Thickness/ Layer (nm) | SiO2 Layer Number of Layer | SiC Layer Film Thickness/ Layer | SiC Layer % to $SiO_2$ | SiC Layer Number of Layer | SiC Layer Hydrogen Concentration (%) | Vickers Hardness HV | Transmissivity (%) | Dynamic Friction Coefficient μk |
|---|---|---|---|---|---|---|---|---|---|---|---|
| **20 | BK7 | 7000 | 15 | 350 | 5 | 33 | 350 | 0 | 1700 | 60 | 0.20 |
| 21 | | | | | | | | 3 | 1700 | 70 | 0.20 |
| 5 | | | | | | | | 5 | 1700 | 77 | 0.17 |
| 22 | | | | | | | | 10 | 1800 | 85 | 0.17 |
| 23 | | | | | | | | 20 | 1800 | 90 | 0.17 |

**indicates a reference example.

The followings can be understood from Table 1. When changing a film thickness of the laminated film 102 by chang- The followings can be understood from Table 2. When an amount of introducing hydrogen to the region 60 (hydrogen concentration) increases when forming a SiC layer 106, superior usability to that of the samples with no hydrogen introduced (experimental example 20 and reference example) was confirmed.

The invention claimed is:

1. A translucent hard thin film formed on a surface of a substrate comprising:
   a laminated film having a superlattice structure in which 150 or more $SiO_2$ layers and SiC layers are stacked alternately;
   wherein each $SiO_2$ layer has a thickness of 5 nm to 30 nm and each SiC layer is 30% to 60% the thickness of each $SiO_2$ layer; and
   an entire film thickness thereof is 3000 nm or more and at least one of the $SiO_2$ layers is formed as a first layer and at least another of the $SiO_2$ layers is formed as a last layer.

2. A translucent hard thin film according to claim 1, wherein the SiC layer is formed on a surface of the substrate or already formed $SiO_2$ layer by a method below;
   a film forming method of a thin film, using a film formation apparatus having a configuration that a reaction processing region and a plurality of film forming regions are arranged being spatially separated from one another in a single vacuum container, each region can be controlled independently and processing is performed on a moving substrate; wherein
   after performing sputtering on any of a plurality of targets made of different materials in the respective film formation processing regions in an inert gas atmosphere to form an interlayer thin film containing silicon and carbon, the interlayer thin film is exposed to plasma generated under an atmosphere of a mixed gas of an inert gas and hydrogen in the reaction processing region to obtain an ultrathin film by film conversion, then, formation of the interlayer thin film and film conversion into the ultrathin film are repeated to the ultrathin film.

3. An optical substrate, wherein the translucent hard thin film according to claim 1 is formed on the substrate made of glass.

4. The optical substrate according to claim 3, wherein a wavelength is 650 nm to 700 nm, transmissivity is 70% or higher, Vickers hardness on the thin film side is 1500 or higher and a coefficient of dynamic friction is 0.5 or smaller.

5. An optical substrate, wherein the translucent hard thin film according to claim 2 is formed on the substrate made of glass.

6. The optical substrate according to claim 5, wherein a wavelength is 650 nm to 700 nm, transmissivity is 70% or higher, Vickers hardness on the thin film side is 1500 or higher and a coefficient of dynamic friction is 0.5 or smaller.

* * * * *